United States Patent
Murakami et al.

(10) Patent No.: US 10,553,409 B2
(45) Date of Patent: Feb. 4, 2020

(54) METHOD OF CLEANING PLASMA PROCESSING APPARATUS

(71) Applicant: Tokyo Electron Limited, Tokyo (JP)

(72) Inventors: Hiraku Murakami, Miyagi (JP); Masaru Isago, Miyagi (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 15/976,107

(22) Filed: May 10, 2018

(65) Prior Publication Data

US 2018/0330930 A1    Nov. 15, 2018

(30) Foreign Application Priority Data

May 12, 2017  (JP) .................... 2017-095746
May 10, 2018  (JP) .................... 2018-091107

(51) Int. Cl.
*B08B 7/00*     (2006.01)
*H01J 37/32*    (2006.01)
*B08B 9/027*    (2006.01)
*B08B 5/02*     (2006.01)
*H01L 21/67*    (2006.01)

(52) U.S. Cl.
CPC .......... *H01J 37/32862* (2013.01); *B08B 5/02* (2013.01); *B08B 9/027* (2013.01); *H01J 37/32871* (2013.01); *B08B 2209/032* (2013.01); *H01L 21/67069* (2013.01)

(58) Field of Classification Search
CPC .... B08B 7/00; B08B 9/00; B08B 9/08; H01L 21/3065; H01L 21/67069; C23C 16/4405
See application file for complete search history.

(56) References Cited

U.S. PATENT DOCUMENTS

2004/0149214 A1* 8/2004 Hirose ............ H01J 37/32458
                                                118/715

FOREIGN PATENT DOCUMENTS

JP          2007-214512       8/2007

* cited by examiner

*Primary Examiner* — Mikhail Kornakov
*Assistant Examiner* — Ryan L. Coleman
(74) *Attorney, Agent, or Firm* — IPUSA, PLLC (57) ABSTRACT

There is provision of a cleaning method of a plasma processing apparatus including a plasma treatment chamber for applying plasma treatment to a substrate. The method includes: insulating a part of the plasma treatment chamber, generating plasma of fluorocarbon gas in the plasma treatment chamber, and removing deposits on a non-plasma surface of a space outside of the plasma treatment chamber, by the plasma of the fluorocarbon gas introduced from the plasma treatment chamber to the outside space.

8 Claims, 9 Drawing Sheets

| BtmPower 1400 W | Press [mT] | | | |
|---|---|---|---|---|
| | 40 | 70 | 100 | 150 |
| Top Power [W] 800 | | | | |
| 900 | | | | |
| 1000 | | | | |
| 1100 | | | | |
| 1200 | | | | |
| 1300 | | | | |
| 1400 | | | | ○ |

FIG.5B

| BtmPower 1400 W | Press [mT] | | | |
|---|---|---|---|---|
| | 40 | 70 | 100 | 150 |
| Top Power [W] 800 | | | ○ | ○ |
| 900 | | ○ | ○ | ○ |
| 1000 | | ○ | ○ | ○ |
| 1100 | ○ | ○ | ○ | ○ |
| 1200 | ○ | ○ | ○ | ○ |
| 1300 | ○ | ○ | ○ | ○ |
| 1400 | ○ | ○ | ○ | ○ |

| Top Power [W] | Press [mT] | | | | | |
|---|---|---|---|---|---|---|
| | 10 | 20 | 40 | 70 | 100 | 150 |
| 100 | | | | | | |
| 300 | | | | | | |
| 500 | | | ★ | | | |
| 700 | | | | | | |
| 900 | | | | | | |
| 1000 | | | | | | ○ |
| 1100 | | | | | | ○ |
| 1200 | | | | | ○ | ○ |
| 1400 | | | | | ○ | ○ |

| Top Power [W] | Press [mT] | | | | | |
|---|---|---|---|---|---|---|
| | 10 | 20 | 40 | 70 | 100 | 150 |
| 100 | | | | | | |
| 300 | | | | | | |
| 500 | | | | ★ | | |
| 700 | | | | | | |
| 900 | | | | | | |
| 1000 | | | | | | |
| 1100 | | | | | | |
| 1200 | | | | | | |
| 1400 | | | | | | |

METHOD OF CLEANING PLASMA PROCESSING APPARATUS

CROSS-REFERENCE TO RELATED APPLICATIONS

This patent application is based upon and claims the benefit of priority of Japanese Patent Application No. 2017-095746 filed on May 12, 2017, and Japanese Patent Application No. 2018-091107 filed on May 10, 2018, the entire contents of which are incorporated herein by reference.

BACKGROUND OF THE INVENTION

1. Field of the Invention

The present invention generally relates to a method of cleaning a plasma processing apparatus.

2. Description of the Related Art

In a plasma processing apparatus, after a plasma-treated wafer is unloaded, oxygen gas is introduced into a plasma processing chamber, which is a space for generating plasma, and dry-cleaning is performed (see Patent Document 1 for example). In a technique disclosed in Patent Document 1, a pressure in the plasma processing chamber is set between 26.7 and 80.0 Pa, and oxygen gas plasma is generated to perform dry-cleaning. Patent Document 1 further discloses that a removal process of oxide is executed, which is performed by introducing tetrafluoromethane into the plasma processing chamber and generating tetrafluoromethane gas plasma.

However, it is difficult to introduce plasma into a non-plasma region of the plasma processing apparatus located outside the plasma processing chamber. Thus, it is difficult for the above disclosed dry-cleaning process to remove deposits from the non-plasma region. For the above disclosed dry-cleaning process, especially under a low-pressure condition necessary for removing deposits such as oxide film, introducing plasma into the non-plasma region is difficult.

CITATION LIST

Patent Document

[Patent Document 1] Japanese Laid-open Patent Application Publication No. 2007-214512

SUMMARY OF THE INVENTION

In one aspect, the present invention aims at removing deposits from the non-plasma region of the plasma processing apparatus by a given plasma, under a low-pressure condition.

To solve the above problem, according to an aspect of the present invention, there is provision of a cleaning method of a plasma processing apparatus including a plasma treatment chamber for applying plasma treatment to a substrate. The method, performed after unloading the plasma-treated substrate, includes: insulating a part of the plasma treatment chamber, generating plasma of fluorocarbon gas in the plasma treatment chamber, and removing deposits on a non-plasma surface of a space outside of the plasma treatment chamber, by the plasma of the fluorocarbon gas introduced from the plasma treatment chamber to the outside space.

DETAILED DESCRIPTION OF EMBODIMENTS

In the following, embodiments of the present invention will be described with reference to the drawings. Note that in the following descriptions and the drawings, elements having substantially identical features are given the same reference symbols and overlapping descriptions may be omitted.

[Plasma Processing Apparatus]

Figure 1:
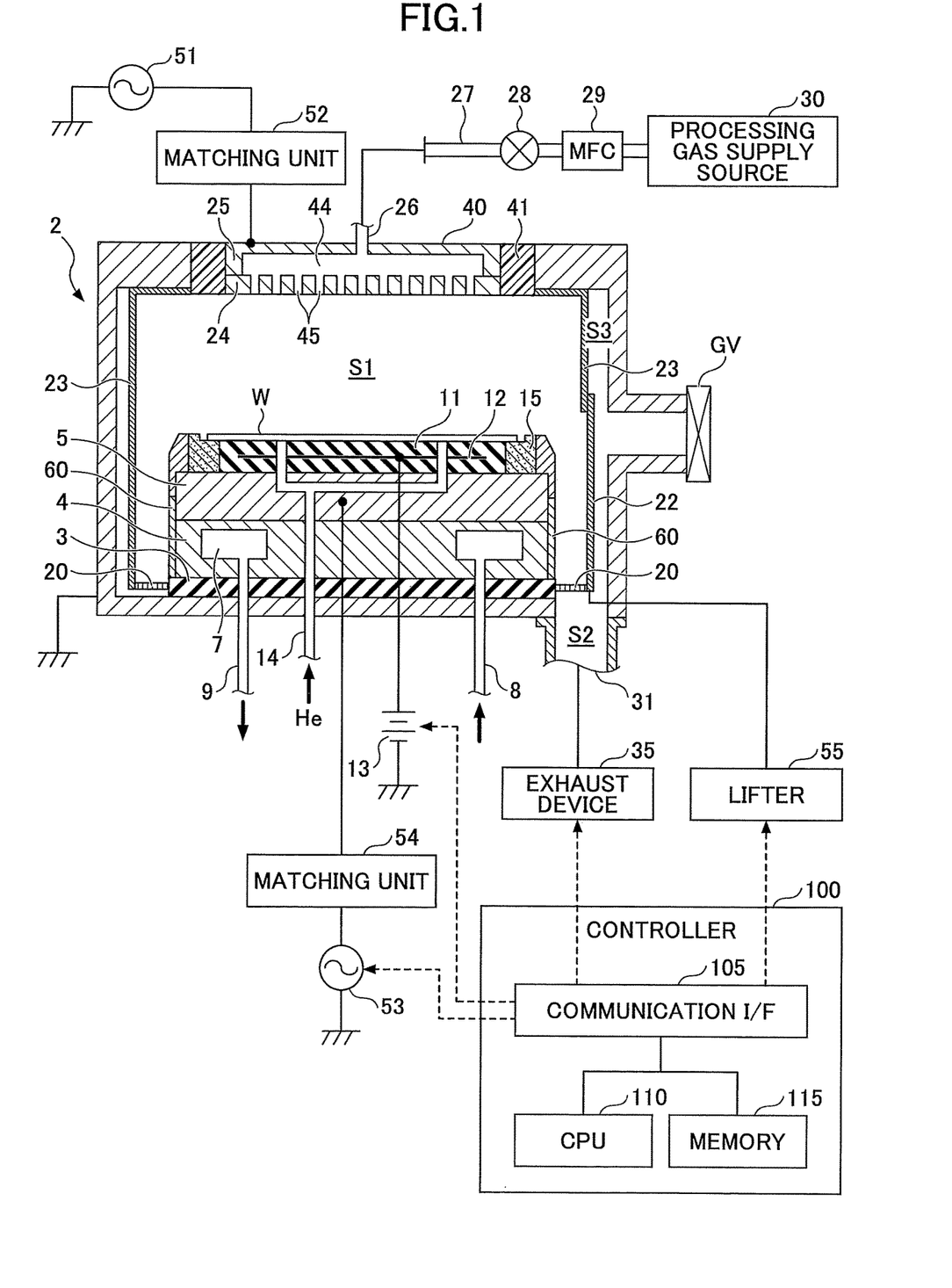
FIG. 1 is a view illustrating an example of a plasma processing apparatus according to an embodiment of the present invention.

First, a plasma processing apparatus according to an embodiment of the present invention is described. FIG. 1 is a view illustrating an example of the plasma processing apparatus according to the present embodiment. The plasma processing apparatus according to the present embodiment includes a substantially cylindrical processing vessel 2. For example, the processing vessel 2 is formed of aluminum, and anodic oxidation treatment is applied on a surface of the processing vessel 2. The processing vessel 2 is grounded.

At a bottom of the processing vessel 2, a substantially cylindrical supporting base 4 is disposed via an insulating plate 3 made of a ceramic or the like. On the supporting base 4, a stage 5 is disposed for holding a wafer W. The stage 5 also acts as a lower electrode (bottom electrode).

Inside the supporting base 4, a cooling chamber 7 is provided. Coolant is introduced into the cooling chamber 7 via an introduction pipe 8. The coolant circulates through the cooling chamber 7 and is drained to a drain pipe 9. Further, gas pathways 14 are formed in the insulating plate 3, the supporting base 4, the stage 5, and an electrostatic chuck 11, for supplying heat transmitting medium (such as helium gas) on the back surface of the wafer W. As heat of the stage 5 is transmitted to the wafer W through the heat transmitting medium, temperature of the wafer W is kept constant.

The electrostatic chuck 11 is disposed on the middle of the upper surface of the stage 5. The electrostatic chuck 11 is circular, and has a diameter similar to the wafer W. The electrostatic chuck 11 is formed of an insulating member, and an attracting electrode 12 is inside the insulating member. As a direct current power source 13 is connected to the attracting electrode 12, Coulomb force occurs by a direct current applied from the direct current power source 13, and the wafer W is attracted to the electrostatic chuck 11 by the Coulomb force.

On a periphery of the upper surface of the stage 5, an annular focus ring 15 is disposed so as to surround the wafer W placed on the electrostatic chuck 11. The focus ring 15 is made from a conductive material such as silicon, and is useful for making a distribution of plasma uniform. A side of the stage 5 is covered with a stage side coating member 60.

Above the stage 5, a gas shower head 40 is provided. The gas shower head 40 is arranged so as to face the stage 5 that acts as the lower electrode, and the gas shower head 40 acts as an upper electrode (top electrode). The gas shower head 40 is mounted to the ceiling of the processing vessel 2 through an insulating member 41. The gas shower head 40 includes an electrode plate 24, and an electrode supporting unit 25 formed of a conductive member for supporting the electrode plate 24. The electrode plate 24 is formed of a conductor or a semiconductor such as silicon or SiC, and a large number of gas holes 45 are provided on the electrode plate 24. The electrode plate 24 forms an opposite surface facing the stage 5.

A gas inlet 26 is formed at the center of the electrode supporting unit 25, and a gas supply pipe 27 is connected to the gas inlet 26. A processing gas supply source 30 is connected to the gas supply pipe 27 via a valve 28 and a mass flow controller (MFC) 29. The processing gas supply source 30 supplies processing gas used for plasma treatment such as an etching, and supplies cleaning gas used for cleaning processing. Gas flow is controlled by the mass flow controller (MFC) 29, and in response to opening of the valve 28, gas is supplied to a gas diffusion chamber 44 via the gas supply pipe 27 and the gas inlet 26. Gas is diffused over the whole gas diffusion chamber 44, and is introduced inside the processing vessel 2 from the large number of the gas holes 45.

A deposhield (deposition shield) 23 may be detachably disposed inside the processing vessel 2 to prevent reaction products, generated by plasma treatment such as etching, from being deposited on the inner wall of the processing vessel 2. The deposhield 23 may also be disposed in an exhaust space S2 on a side surface of the supporting base 4 or the stage 5.

An annular baffle plate 20 is disposed between the deposhield 23 and the stage 5 (or the supporting base 4, the insulating plate 3). As a material of the deposhield 23 and the baffle plate 20, an aluminum member coated with a ceramic such as aluminum oxide or yttria ($Y_2O_3$) can be preferably used.

The baffle plate 20 acts to discharge gas from a plasma treatment chamber S1 to the exhaust space S2 uniformly, by regulating a flow of gas. The plasma treatment chamber S1 is a space for generating plasma (plasma treatment space) formed of the stage 5, the gas shower head 40, the deposhield 23, and the baffle plate 20. Inside the plasma treatment chamber S1, plasma is generated from gas supplied from the gas shower head 40, and treatment by the plasma is applied to the wafer W.

On a part of the plasma treatment chamber S1, an openable shutter 22 is provided. When loading or unloading the wafer W, a gate valve GV is opened and the shutter 22 is pulled down by actuating a lifter 55, to open the shutter 22. The wafer W is loaded into the plasma treatment chamber S1 and unloaded from the plasma treatment chamber S1 through an opening of the shutter 22.

Under the baffle plate 20 disposed at a bottom of the plasma treatment chamber S1, the exhaust space S2 is formed for exhausting. The baffle plate 20 can prevent plasma from entering the exhaust space S2 located downstream from the baffle plate 20.

A first high frequency power source 51 generates high frequency electric power HF for generating plasma. The first high frequency power source 51 generates, for example, high frequency electric power HF of 60 MHz. The first high frequency power source 51 is connected to the gas shower head 40 via a matching unit 52. The matching unit 52 is a circuit for matching an output impedance of the first high frequency power source 51 and an input impedance of a load (a circuit on a side of the upper electrode).

A second high frequency power source 53 generates high frequency bias electric power LF for drawing ions into the wafer W. The second high frequency power source 53 generates, for example, high frequency bias electric power LF of 20 MHz. The second high frequency power source 53 is connected to the stage 5 via a matching unit 54. The matching unit 54 is a circuit for matching an output impedance of the second high frequency power source 53 and an input impedance of a load (a circuit on a side of the lower electrode).

A drain pipe 31 is connected to a bottom of the processing vessel 2, and an exhaust device 35 is connected to the drain pipe 31. The exhaust device 35 includes a vacuum pump such as a turbomolecular pump, and can evacuate the inside of the processing vessel 2 at a predetermined pressure. Further, the gate valve GV is provided at a side wall of the processing vessel 2. By opening the gate valve GV, the wafer W is loaded into the processing vessel 2 or unloaded from the processing vessel 2.

The plasma processing apparatus is controlled by a controller 100. The controller 100 is a computer including a communication interface (I/F) 105, a CPU 110, a memory 115, and the like. The memory 115 includes a control program for causing the CPU 110 to control various plasma treatment performed in the plasma processing apparatus such as etching, and includes a recipe, which is a type of a program for causing each component in the plasma processing apparatus to perform various processing in accordance with processing conditions. The CPU 110 controls each of the components (such as the lifter 55, the exhaust device 35, the direct current power source 13, the first high frequency power source 51, the second high frequency power source 53, or the processing gas supply source 30) in the plasma processing apparatus using the recipe and the control program stored in the memory 115.

First Embodiment

[Cleaning Method of Plasma Processing Apparatus]

Figure 2:
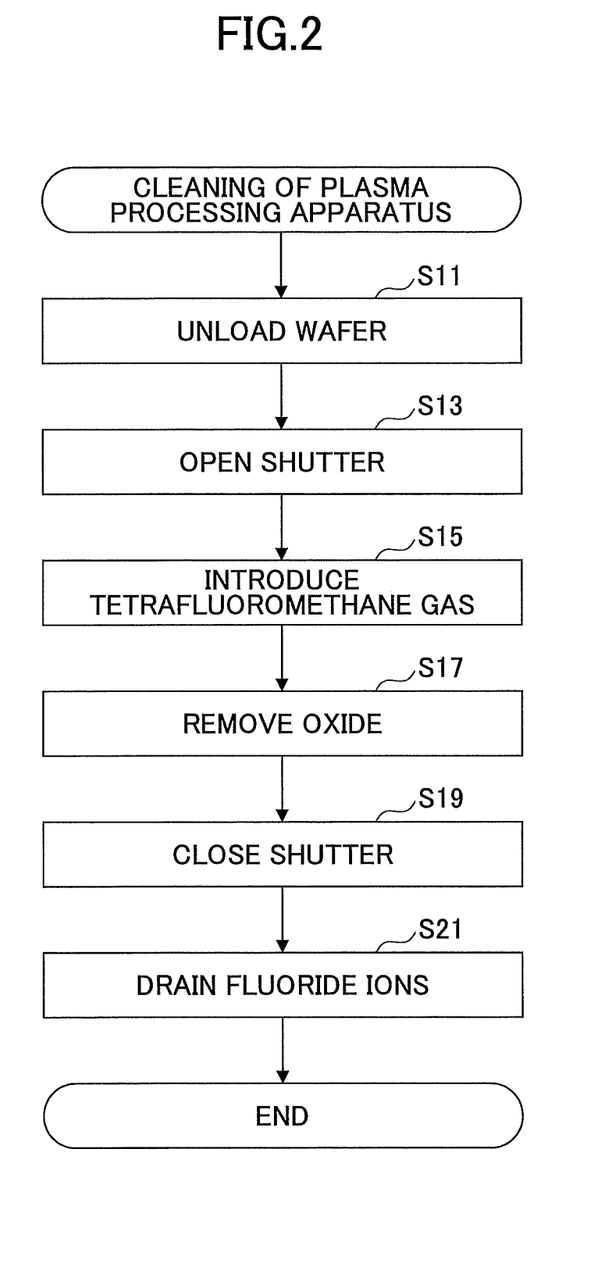
FIG. 2 is a flowchart illustrating an example of a cleaning process of the plasma processing apparatus according to a first embodiment.

Next, cleaning methods of the above described plasma processing apparatus will be described in an order of a first, second, third and fourth embodiment. First, an example of a method of cleaning the plasma processing apparatus according to the first embodiment will be described with reference to FIG. 2. FIG. 2 is a flowchart illustrating an example of a cleaning process of the plasma processing apparatus according to the first embodiment.

It should be noted that, before starting the process, a predetermined plasma treatment, such as etching and depositing, has been applied to the wafer W. When the process is started, the gate valve GV is opened by control of the controller 100, the wafer W to which treatment has been applied is unloaded from the processing vessel 2 (step S11), and the shutter 22 is opened (step S13). Step S13 is an example of a first step of insulating a part of a region in the plasma treatment chamber S1 of the processing vessel 2. In other words, in the present embodiment or in the embodiments to be described below, a gap, which is an insulated region, can be formed in a part of the plasma treatment chamber S1 by opening the shutter 22 provided inside the processing vessel 2 (that is, an opening of the shutter 22 is the insulated region).

Next, tetrafluoromethane gas is introduced from the gas shower head 40 (step S15). Step S15 is an example of a second step of generating plasma of fluorocarbon gas introduced into the plasma treatment chamber S1. In the present embodiment, as an example of fluorocarbon gas, tetrafluoromethane gas ($CF_4$ gas) is introduced. However, the gas introduced here is not limited to $CF_4$ gas, and at least one of $CF_4$ gas, $C_4F_6$ gas, $C_5F_8$ gas, and $C_6F_6$ gas may be introduced.

Next, an oxide removal process is performed by control of the controller 100 (step S17). Specifically, the tetrafluoromethane gas introduced at step S15 is supplied, through the insulated region formed in a part of the plasma treatment chamber, to a non-plasma space S3, which is outside the plasma treatment chamber S1 and inside the processing vessel 2, and is supplied to the exhaust space S2 (which is also a non-plasma space). By the introduced tetrafluoromethane gas plasma, deposits on surfaces of the non-plasma space S3 and the exhaust space S2, such as silicon oxide film, are removed. In the following, the surfaces of the non-plasma space S3 and the exhaust space S2 are called "non-plasma surfaces".

Next, the shutter 22 is closed (step S19), fluoride ions and the like are drained from the plasma processing apparatus by the exhaust device 35 (step S21), and the process terminates.

Figure 3A:
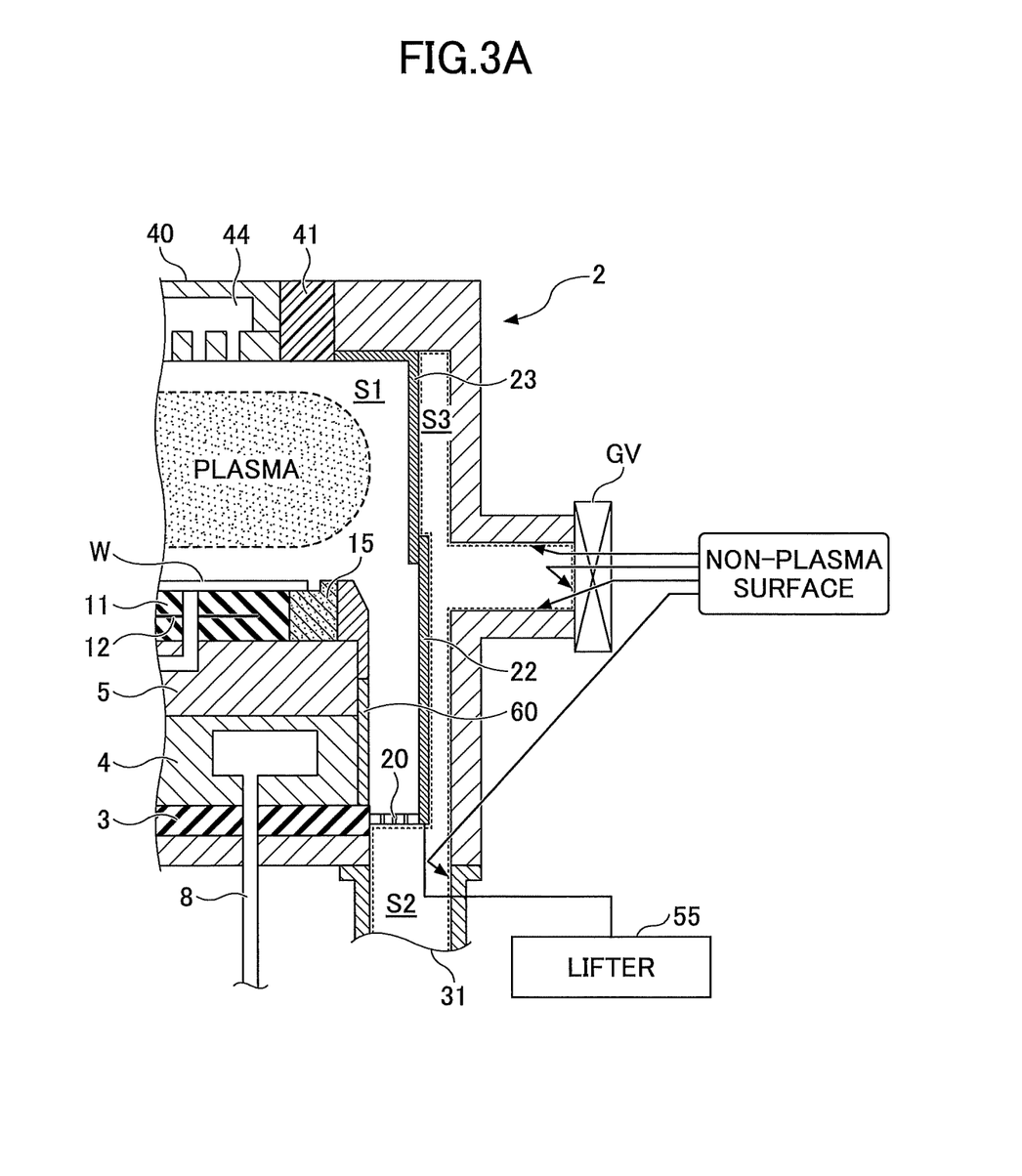
FIGS. 3A and 3B are views illustrating a closed state and an opened state of a shutter of the plasma processing apparatus.

As illustrated in FIG. 3A, while plasma treatment is being applied to the wafer W, the shutter 22 is closed, and treatment gas is introduced into the plasma treatment chamber S1 which is a closed space surrounded by the deposhield 23, the baffle plate 20, the stage 5, and the gas shower head 40. The treatment gas is ionized or dissociated mainly by the high frequency electric power HF, and plasma is generated. The shutter 22 is grounded, and an electrical potential of the shutter 22 is the same as that of the deposhield 23 and the baffle plate 20. Accordingly, the generated plasma is confined in a region of the plasma treatment chamber S1 above the wafer W, and desired plasma treatment is applied to the wafer W.

While plasma treatment is applied to the wafer W, a reaction product such as silicon oxide ($SiO_x$) film is generated and deposited on inner walls of the plasma treatment chamber S1. Part of the reaction product is deposited gradually on the non-plasma surfaces of the non-plasma space S3 and the exhaust space S2, which is outside of the plasma treatment chamber S1 surrounded by the deposhield 23, the baffle plate 20, and the shutter 22.

Thus, in the cleaning method according to the present embodiment, by opening the shutter 22, the deposited reaction product is cleaned and removed from not only the surfaces of the plasma treatment chamber S1, but also the non-plasma surfaces of the non-plasma space S3 and the exhaust space S2.

Figure 3B:
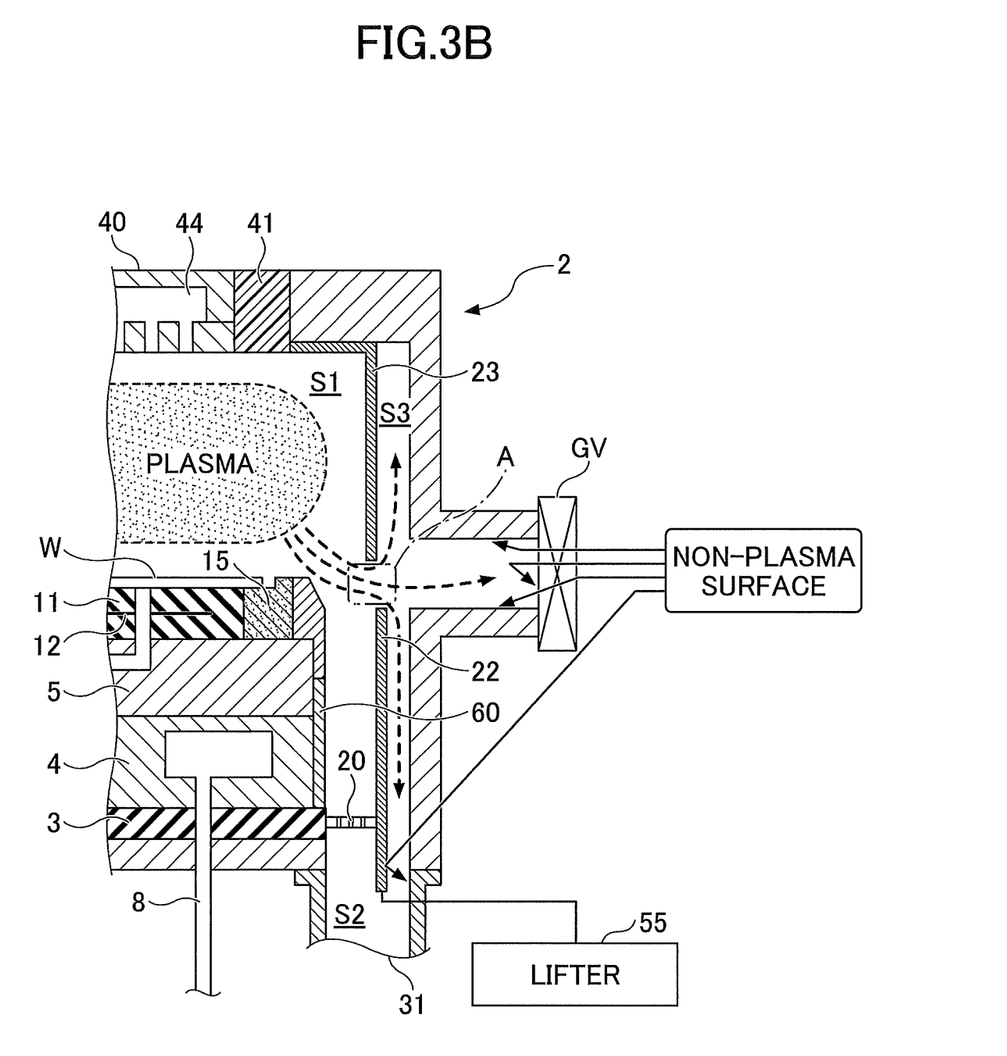

The cleaning method will be described specifically below with reference to FIG. 3A and FIG. 3B. In the cleaning method according to the present embodiment, after plasma treatment is applied to the wafer W as illustrated in FIG. 3A, the plasma-treated wafer W is unloaded and the shutter 22 is opened as illustrated in FIG. 3B. When the wafer W having been processed is unloaded, the shutter 22 may not be closed and be kept opened. According to the present embodiment, the shutter 22 for shielding plasma is opened during cleaning, to create an insulating region A (corresponding to the opening of the shutter 22) in a part of the plasma treatment chamber S1.

As described above, in the present embodiment, by opening the shutter 22, the insulating region A which is electrically floating is formed, as illustrated in FIG. 3B. As the processing vessel 2 outside the plasma treatment chamber S1 is grounded, a voltage occurs between the electrically floating insulating region A and the surface of the processing vessel 2.

During cleaning, tetrafluoromethane gas is introduced into the plasma treatment chamber S1, and tetrafluoromethane gas plasma, which is plasma for cleaning, is generated. The tetrafluoromethane gas plasma is guided, via the insulating region A (the opening of the shutter 22) having a higher voltage than the non-plasma surfaces, to the grounded non-plasma surfaces of the non-plasma space S3 and the exhaust space S2.

Electrical behavior of plasma during the cleaning process of the plasma processing apparatus according to the first embodiment has been described as above, in which plasma enters the non-plasma space S3 and the exhaust space S2 because of an electrical potential difference occurring between the opening of the shutter 22 and the non-plasma surfaces of the non-plasma space S3 and the exhaust space S2. In addition, because the gap (an outlet of plasma) is formed in a part of the plasma treatment chamber S1 by opening the shutter 22 during cleaning, plasma moves from the gap (the opening of the shutter 22) toward the non-plasma space S3 and the exhaust space S2. Accordingly, the deposited reaction product can be cleaned effectively not only from the plasma treatment chamber S1 but also from the non-plasma surfaces of the non-plasma space S3 and the exhaust space S2, and can be eliminated by discharging gas.

Second Embodiment

[Cleaning Method of Plasma Processing Apparatus]

Figure 4:
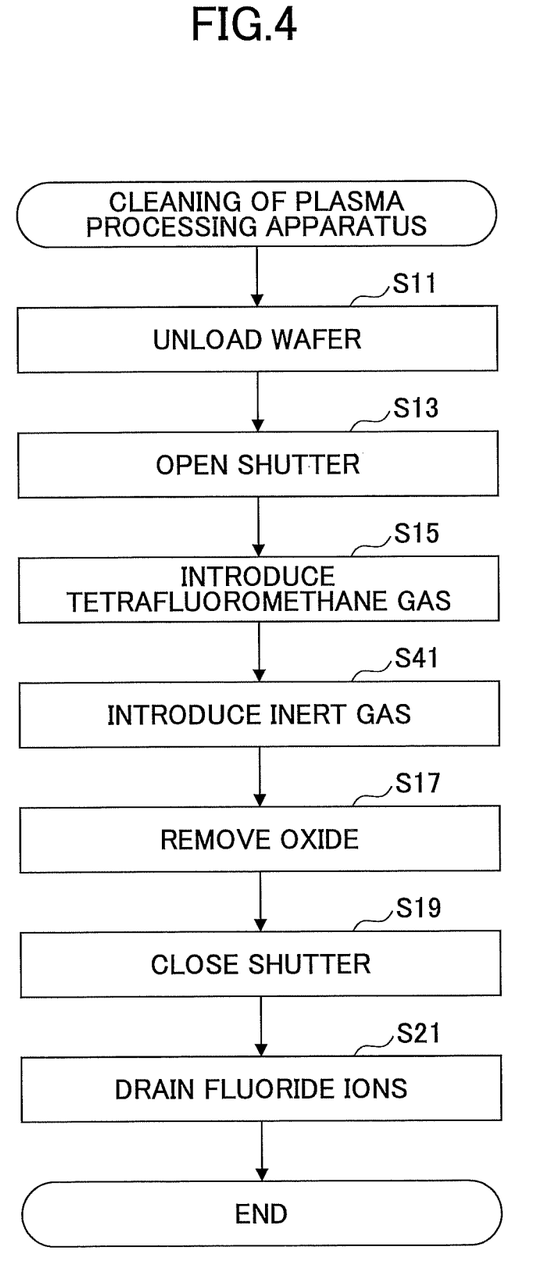
FIG. 4 is a flowchart illustrating an example of a cleaning process of the plasma processing apparatus according to a second embodiment.

Next, an example of a method of cleaning the plasma processing apparatus according to the second embodiment will be described with reference to FIG. 4. FIG. 4 is a flowchart illustrating an example of a cleaning process of the plasma processing apparatus according to the second embodiment. With respect to a step in the cleaning process of the plasma processing apparatus according to the second embodiment illustrated in FIG. 4 equivalent to the step in the cleaning process of the plasma processing apparatus according to the first embodiment illustrated in FIG. 2, the same reference symbol is attached and the description about the step will be omitted.

The method of cleaning the plasma processing apparatus according to the second embodiment differs from the method of cleaning the plasma processing apparatus according to the first embodiment only in that a step of introducing inert gas (step S41) is performed between a step of introducing tetrafluoromethane gas (step S15) and a step of removing oxide (step S17).

In the present embodiment, similar to the first embodiment, when cleaning, an insulating region A is created by opening the shutter 22, and part of tetrafluoromethane gas plasma and inert gas plasma is guided to the non-plasma space S3 and the exhaust space S2. In the present embodiment, by forming a state in which a pressure in the plasma treatment chamber S1 and a pressure in the non-plasma space S3 and the exhaust space S2 are unequal, plasma is guided to the non-plasma space S3 and the exhaust space S2.

Especially in the present embodiment, by adding inert gas to tetrafluoromethane gas, plasma can be guided to the non-plasma space S3 and the exhaust space S2 more efficiently due to Penning effect.

When electricity is discharged into a space in which two types of gases are enclosed, electric discharge occurs at a lower voltage than a voltage required for discharging into a single gas. This phenomenon is referred to as the Penning effect. In the present embodiment, by supplying two types of gases (tetrafluoromethane gas and inert gas), electric discharge and plasma generation occur at a lower pressure than a pressure required for discharging into a single tetrafluoromethane gas due to the Penning effect. For example, by adding Ar gas to $CF_4$ gas, plasma can be generated at a lower pressure than a case in which plasma is generated from only $CF_4$ gas.

In a case in which cleaning is performed while the shutter 22 is closed, plasma for cleaning cannot be guided to the exhaust space S2 or the non-plasma space S3 unless pressure in the plasma treatment chamber S1 of the processing vessel 2 is high.

Figure 5A:
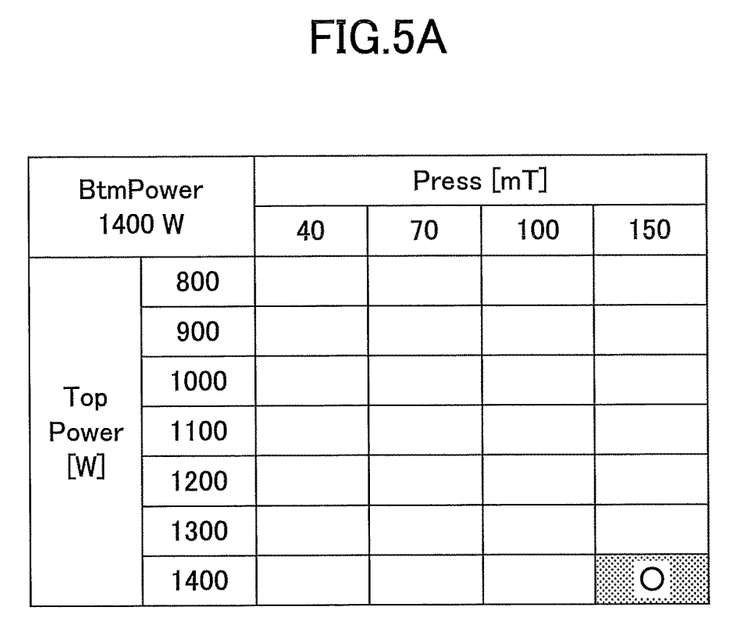
FIGS. 5A and 5B are tables illustrating a relation between pressure and high frequency electric power during cleaning.
Figure 5B:
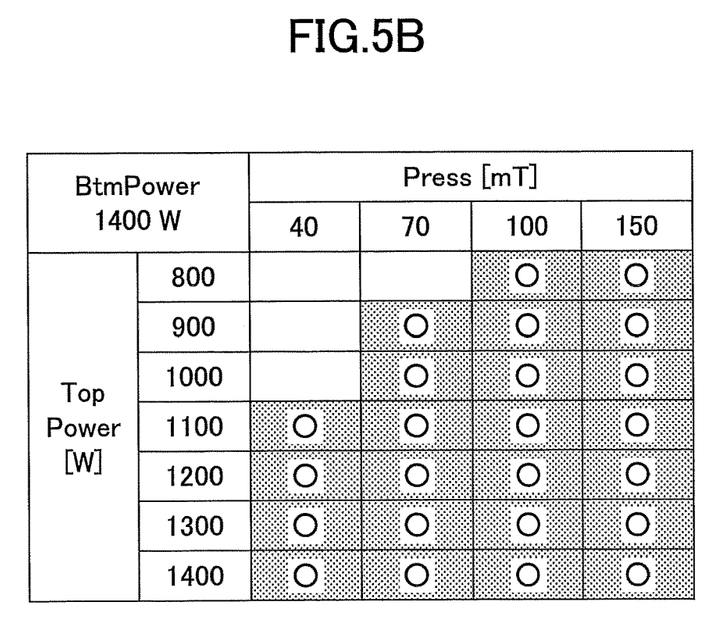

For example, FIG. 5A and FIG. 5B are tables illustrating a relation between pressure in the plasma treatment chamber S1 and the high frequency electric power HF during cleaning. A value assigned to each row represents a high frequency electric power applied to the upper electrode. A value assigned to each column represents a pressure in the plasma treatment chamber S1. A round mark in a field of the table represents that plasma can be guided to the non-plasma space S3 and the exhaust space S2 when high frequency electric power HF assigned to the corresponding row is applied to the upper electrode and a pressure assigned to the corresponding column is applied to the plasma treatment chamber S1. FIG. 5A represents a case in which plasma is generated from mixed gas of $CF_4$ gas and Ar gas, and in which cleaning is performed while the shutter 22 is closed as illustrated in FIG. 3A. As illustrated in FIG. 5A, when the high frequency electric power HF applied to the upper electrode is 1400 W, and the pressure in the plasma treatment chamber S1 is 150 mTorr (=20.0 Pa), plasma can be guided to the non-plasma space S3 and the exhaust space S2. Note that the high frequency electric power LF applied to the lower electrode is 1400 W.

According to FIG. 5A, when the high frequency electric power HF is not more than 1300 W, plasma cannot be guided to the non-plasma space S3 and the exhaust space S2 even if the pressure in the plasma treatment chamber S1 is 150 mTorr. Further, even if the high frequency electric power HF of 1400 W is applied, when the pressure in the plasma treatment chamber S1 is less than 150 mTorr, plasma cannot be guided to the non-plasma space S3 and the exhaust space S2.

However, since removal of silicon oxide ($SiO_x$) film or silicon nitride ($SiN_x$) film using plasma needs to be performed at a low pressure environment, it is preferable that the pressure in the plasma treatment chamber S1 is less than 150 mTorr.

Therefore, in the present embodiment, plasma is generated from mixed gas of $CF_4$ gas and Ar gas, and cleaning is performed while the shutter 22 is opened as illustrated in FIG. 3B. As a result, due to the Penning effect, when the high frequency electric power HF is not less than 1100 W, plasma can be guided to the non-plasma space S3 and the exhaust space S2 even if the pressure in the plasma treatment chamber S1 is low (40 mTorr (=5.33 Pa), for example), as illustrated in FIG. 5B. Also, even if the high frequency electric power HF is less than 1100 W, if the high frequency electric power HF is not less than 900 W, plasma can be guided to the non-plasma space S3 and the exhaust space S2 under a low pressure condition of the plasma treatment chamber S1 (such as not less than 70 mTorr (=9.33 Pa)). Further, even if the high frequency electric power HF is less than 900 W, plasma can be guided to the non-plasma space S3 and the exhaust space S2 when the pressure in the plasma treatment chamber S1 is not less than 100 mTorr (=13.33 Pa).

Accordingly, when cleaning is to be performed, by opening the shutter 22 to create an insulating region A and by introducing two or more types of cleaning gases, plasma can be guided to the non-plasma space S3 and the exhaust space S2 even if the pressure in the plasma treatment chamber S1 is low (40 mTorr, for example). Hence, the deposited reaction product can be cleaned effectively not only from the plasma treatment chamber S1 but also from the non-plasma surfaces of the non-plasma space S3 and the exhaust space S2.

Third Embodiment

[Cleaning Method of Plasma Processing Apparatus]

Figure 6:
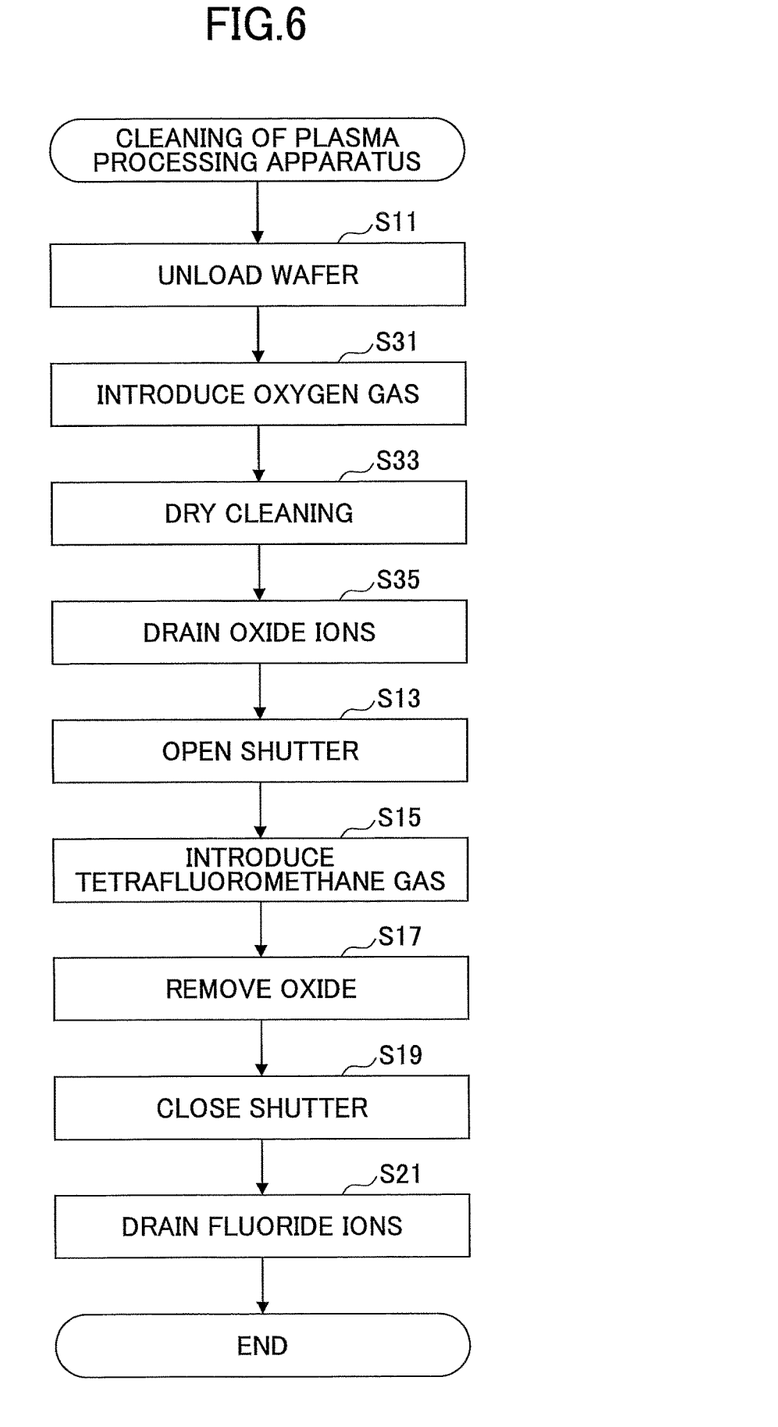
FIG. 6 is a flowchart illustrating an example of a cleaning process of the plasma processing apparatus according to a third embodiment.

Next, an example of a method of cleaning the plasma processing apparatus according to the third embodiment will be described with reference to FIG. 6. FIG. 6 is a flowchart illustrating an example of a cleaning process of the plasma processing apparatus according to the third embodiment. With respect to a step in the cleaning process of the plasma processing apparatus according to the third embodiment illustrated in FIG. 6 equivalent to the step in the cleaning process of the plasma processing apparatus according to the first embodiment illustrated in FIG. 2, the same reference symbol is attached and the description about the step will be simplified or omitted.

The method of cleaning the plasma processing apparatus according to the third embodiment differs from the method of cleaning the plasma processing apparatus according to the first embodiment in that steps (steps S31, S33, and S35) of performing dry cleaning are added after a step (step S11) of unloading a wafer W.

That is, in the present embodiment, after unloading the wafer W, $O_2$ gas is introduced (step S31), $O_2$ gas plasma is generated, and dry cleaning is performed in the plasma treatment chamber S1 using $O_2$ gas plasma (step S33). By performing these steps, silicon oxide film deposited on the walls of the plasma treatment chamber S1 is removed.

It should be noted that, a process of performing dry cleaning using $O_2$ gas plasma is an example of a fourth step of generating plasma of oxygen gas introduced into the plasma treatment chamber S1. The fourth step is performed before performing steps S13 to S17, corresponding to the first to third steps respectively.

Next, after oxide ions and the like are drained from the plasma processing apparatus by the exhaust device 35 (step S35), the shutter 22 is opened (step S13), which is similar to the cleaning process according to the first embodiment. Next, tetrafluoromethane gas is introduced (step S15), and silicon oxide film, deposited on the surfaces of the plasma treatment chamber S1 and the non-plasma surfaces of the exhaust space S2 and the non-plasma space S3, is removed (step S17). After the shutter 22 is closed (step S19) and fluoride ions and the like are drained (step S21), the process terminates.

As described above, in the method of cleaning the plasma processing apparatus according to the third embodiment, first, dry cleaning in the processing vessel 2 using $O_2$ gas plasma is performed. Because of the process, members formed of silicon, such as the gas shower head 40, are oxidized, which will be a source of new particles. For that reason, in the present embodiment, silicon oxide film which is a source of new particles is cleaned using tetrafluoromethane gas plasma, as well as the silicon oxide film deposited on the non-plasma surfaces.

Also in the present embodiment, after the cleaning process using $O_2$ gas plasma, by opening the shutter 22 to create an insulating region A, plasma is guided to the non-plasma space S3 and the exhaust space S2. Accordingly, silicon oxide film deposited on the non-plasma surfaces of the non-plasma space S3 and the exhaust space S2 can be removed.

Fourth Embodiment

[Cleaning Method of Plasma Processing Apparatus]

Figure 7:
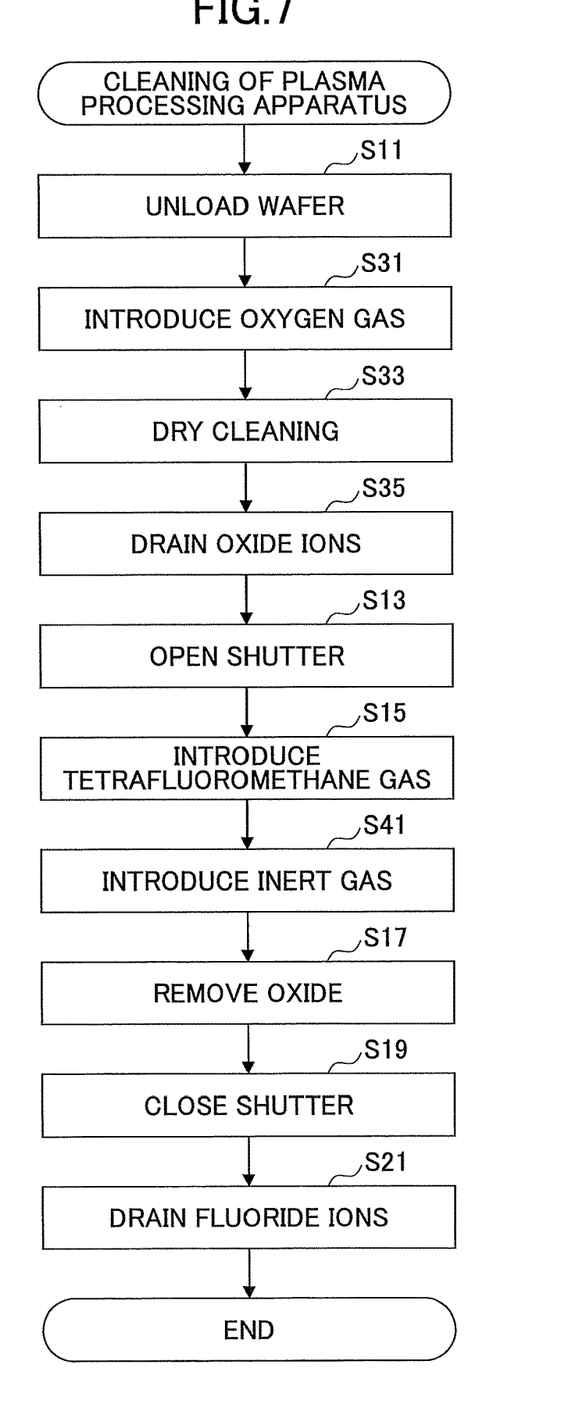
FIG. 7 is a flowchart illustrating an example of a cleaning process of the plasma processing apparatus according to a fourth embodiment.

Next, an example of a method of cleaning the plasma processing apparatus according to the fourth embodiment will be described with reference to FIG. 7. FIG. 7 is a flowchart illustrating an example of a cleaning process of the plasma processing apparatus according to the fourth embodiment. With respect to a step in the cleaning process of the plasma processing apparatus according to the fourth embodiment illustrated in FIG. 7 equivalent to the step in the cleaning process of the plasma processing apparatus according to the third embodiment illustrated in FIG. 6, the same reference symbol is attached and the description about the step will be simplified or omitted.

The method of cleaning the plasma processing apparatus according to the fourth embodiment differs from the method of cleaning the plasma processing apparatus according to the third embodiment only in that a step of introducing inert gas (step S41) is added after a step (step S15) of introducing tetrafluoromethane gas.

That is, in the present embodiment, after unloading a wafer W, $O_2$ gas is introduced (step S31), $O_2$ gas plasma is generated, and dry cleaning is performed using $O_2$ gas plasma (step S33).

Next, after oxide ions and the like are drained from the plasma processing apparatus by the exhaust device 35 (step S35), the shutter 22 is opened (step S13), which is similar to the cleaning process according to the third embodiment. Next, tetrafluoromethane gas and inert gas such as Ar gas are introduced (step S15 and step S41), and silicon oxide film deposited inside the processing vessel 2 is removed (step S17). After the shutter 22 is closed (step S19) and fluoride ions and the like are drained (step S21), the process terminates.

As described above, in the method of cleaning the plasma processing apparatus according to the fourth embodiment, first, dry cleaning using $O_2$ gas plasma is performed. Because of the process, members formed of silicon, such as the gas shower head 40, are oxidized, which will be a source of new particles. For that reason, in the present embodiment, silicon oxide film which is a source of new particles is cleaned using tetrafluoromethane gas plasma and inert gas plasma, as well as the silicon oxide film deposited on the non-plasma surfaces.

Also in the present embodiment, after the cleaning process using $O_2$ gas plasma, by opening the shutter 22 to create an insulating region A, plasma is guided to the non-plasma space S3 and the exhaust space S2.

Further, in the present embodiment, by supplying mixed gas of tetrafluoromethane gas and inert gas, plasma can be generated at a lower pressure than a pressure required for generating plasma from a single tetrafluoromethane gas, due to the Penning effect.

Removal of silicon oxide film using plasma needs to be performed at a low pressure environment. In the present embodiment, by using mixed gas of tetrafluoromethane gas and inert gas, plasma can be generated under the low pressure environment, and silicon oxide film deposited on the non-plasma surfaces of the non-plasma space S3 and the exhaust space S2 can be removed by using mixed gas plasma of tetrafluoromethane gas and inert gas.

For example, by adding Ar gas to $CF_4$ gas, plasma can be generated at a lower pressure than a case in which plasma is generated from only $CF_4$ gas.

Figure 8A:
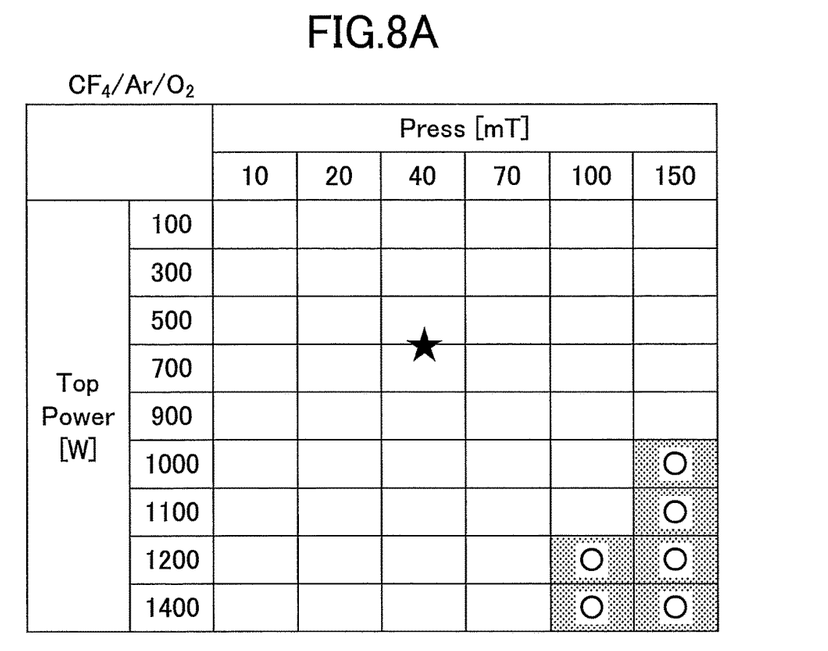
FIGS. 8A and 8B are tables illustrating a relation between pressure and high frequency electric power during cleaning.
Figure 8B:
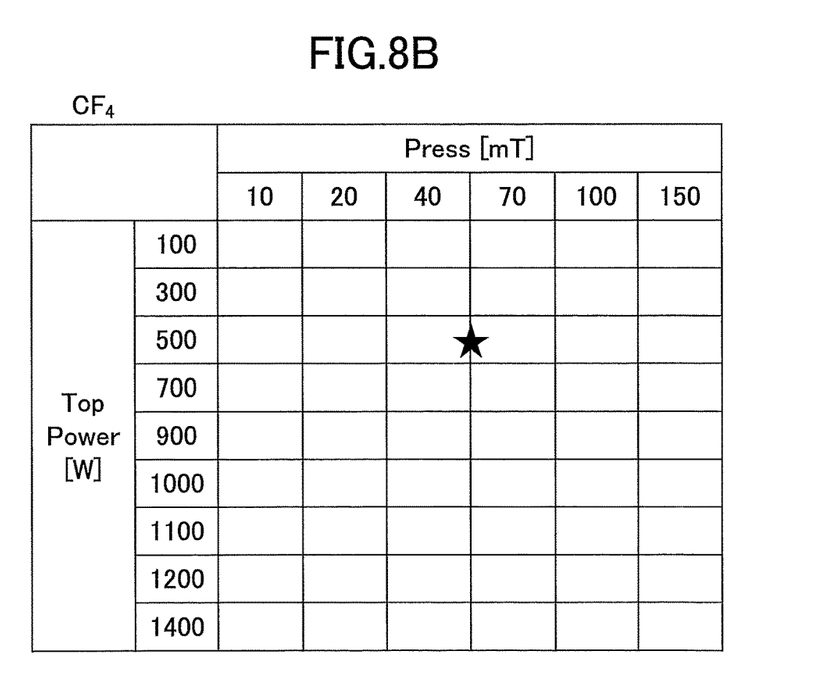

For example, FIG. 8A and FIG. 8B are tables illustrating a relation between pressure in the plasma treatment chamber S1 and the high frequency electric power HF during cleaning. A value assigned to each row represents the high frequency electric power HF applied to the upper electrode. A value assigned to each column represents a pressure in the plasma treatment chamber S1. A round mark represents that plasma can be guided to the non-plasma space S3 and the exhaust space S2. A star mark illustrated in FIG. 8B represents a process condition (the high frequency electric power HF and the pressure) when the cleaning using $O_2$ gas plasma is performed at step S33 in FIG. 6. A star mark illustrated in FIG. 8A represents a process condition when the cleaning using $O_2$ gas plasma is performed at step S33 in FIG. 7.

FIG. 8A represents a result when mixed gas of $CF_4$ gas, Ar gas, and $O_2$ gas is introduced into the plasma treatment chamber S1. FIG. 8B represents a result when only $CF_4$ gas is introduced into the plasma treatment chamber S1. Note that both FIGS. 8A and 8B illustrate cases in which experiments are performed while the shutter 22 is closed. As illustrated in FIG. 8A and FIG. 8B, in a case in which mixed gas of $CF_4$ gas, Ar gas, and $O_2$ gas is introduced into the plasma treatment chamber S1, even if a pressure in the plasma treatment chamber S1 is lower than a case when only $CF_4$ gas is introduced, plasma can be guided to the non-plasma space S3 and the exhaust space S2.

Though FIG. 8A illustrates the case in which $O_2$ gas is supplied in addition to $CF_4$ gas and Ar gas, even if $O_2$ gas is not supplied, plasma can be guided to the non-plasma space S3 and the exhaust space S2 in a lower pressure condition than the case illustrated in FIG. 8B (when only $CF_4$ gas is supplied), due to the Penning effect.

The method of cleaning the plasma processing apparatus is described in the above embodiments. However, the method of cleaning the plasma processing apparatus according to the present invention is not limited to the embodiments described above. Various modifications or improvements can be made within the scope of the present invention. Further, each matter disclosed in the above embodiments can be combined as long as the combination does not cause inconsistency.

In the above embodiments, an example of deposits to be cleaned from the walls of the plasma processing apparatus was silicon oxide film. However, deposits to be removed according to the present invention are not limited to silicon oxide film, and silicon nitride film deposited on the walls of the plasma processing apparatus may be removed. In this case, also, similar to the above described embodiments, plasma of fluorocarbon gas such as $CF_4$ gas, or plasma of fluorocarbon gas and inert gas may be used. Inert gas added to the fluorocarbon gas is not limited to Ar gas, and He gas may be added.

Further, deposits to be removed according to the present invention are not limited to those described above. For example, material containing organic polymers, such as $C_xH_y$ or $C_xF_y$, may be removed. In a case in which material containing organic polymers such as $C_xH_y$ or $C_xF_y$ is to be removed, it is preferable to use gas including oxygen.

Specifically, when the material containing organic polymers such as $C_xH_y$ or $C_xF_y$ is to be removed, the following first, second, and third steps are executed.

At the first step, a part of a region in the plasma treatment chamber S1 is insulated by opening the shutter 22. At the second step, plasma is generated from oxygen-containing gas introduced into the plasma treatment chamber S1. At the third step, the oxygen-containing gas plasma is supplied to the non-plasma surfaces of the non-plasma space S3 and the exhaust space S2, from the insulated region formed in a part of the plasma treatment chamber S1 (the opening of the shutter 22), and thereby deposits on the non-plasma surfaces are removed.

By performing these steps, the material containing organic polymers such as $C_xH_y$ or $C_xF_y$ deposited on the non-plasma surfaces of the non-plasma space S3 and the exhaust space S2 can be removed. In the cleaning method for removing the material containing organic polymers such as $C_xH_y$ or $C_xF_y$ by supplying the oxygen-containing gas plasma to the non-plasma surfaces, at step S15 in FIG. 2 or FIG. 6, oxygen-containing gas may be introduced instead of tetrafluoromethane gas. Also, with respect to steps S15 and S41 in FIG. 4 and FIG. 7, oxygen-containing gas and inert gas may be introduced instead of introducing tetrafluoromethane gas and inert gas.

It should be noted that the shutter 22 is not required to be fully opened during cleaning, and may be partly opened. When the shutter 22 is at least partly opened, the opening of the shutter 22 is electrically insulated and a certain electrical potential difference occurs between the ground and the shutter 22. Accordingly, even if the shutter is partly opened, the effect of cleaning by plasma according to the embodiments can be obtained. However, it is preferable that the shutter 22 is fully opened since plasma for cleaning is easily introduced into the exhaust space S2 and the non-plasma space S3.

The above embodiments describe an example in which only the shutter 22 moves upward or downward by actuating the lifter 55 during cleaning. However, the method of cleaning the plasma processing apparatus according to the present invention is not limited to the example, and the deposhield 23 and the shutter 22 may move upward or downward integrally by actuating the lifter 55 during cleaning.

The cleaning method according to the present invention can be applicable to any types of plasma processing apparatuses, such as an atomic layer deposition (ALD) apparatus, a capacitively coupled plasma (CCP) processing apparatus, an inductively coupled plasma (ICP) processing apparatus, a plasma processing apparatus using radial line slot antenna technology, a plasma processing apparatus using electron cyclotron resonance plasma, and a plasma processing apparatus using helicon wave plasma.

In this specification, the wafer (semiconductor wafer) W is referred to as an example of a substrate. However, the substrate processed by the plasma processing apparatus is not limited to the wafer W. Examples of the substrate may include various types of substrates used in an LCD (Liquid Crystal Display) or a FPD (Flat Panel Display), a photomask, a CD substrate, and a printed circuit board.

What is claimed is:

1. A method of cleaning a plasma processing apparatus including a plasma treatment chamber for applying plasma treatment to a substrate, the method comprising:
   unloading a substrate from the plasma processing apparatus;
   after unloading the substrate, insulating a region of the plasma treatment chamber, wherein the insulating is performed by opening a shutter such that an opening is formed;
   generating plasma in the plasma treatment chamber from fluorocarbon gas; and
   removing deposit on a non-plasma surface of a space outside of the plasma treatment chamber by the plasma, which is able to reach the space outside of the plasma treatment chamber by way of the formed opening.

2. The method of cleaning the plasma processing apparatus according to claim 1, further comprising
   generating oxygen gas plasma in the plasma treatment chamber before the insulating.

3. The method of cleaning the plasma processing apparatus according to claim 1, further comprising
   introducing inert gas before the removing.

4. The method of cleaning the plasma processing apparatus according to claim 3, wherein the inert gas is at least one of Ar gas and He gas.

5. The method of cleaning the plasma processing apparatus according to claim 1, wherein the deposit on the non-plasma surface is at least one of silicon oxide film and silicon nitride film.

6. The method of cleaning the plasma processing apparatus according to claim 1, wherein the fluorocarbon gas is at least one of $CF_4$ gas, $C_4F_6$ gas, $C_5F_8$ gas, and $C_6F_6$ gas.

7. A method of cleaning a plasma processing apparatus including a plasma treatment chamber for applying plasma treatment to a substrate, the method comprising:
   unloading a substrate from the plasma processing apparatus;
   after unloading the substrate, insulating a region of the plasma treatment chamber, wherein the insulating is performed by opening a shutter such that an opening is formed;
   generating plasma in the plasma treatment chamber from oxygen-containing gas; and
   removing deposit on a non-plasma surface of a space outside of the plasma treatment chamber by the plasma, which is able to reach the space outside of the plasma treatment chamber by way of the formed opening.

8. The method of cleaning the plasma processing apparatus according to claim 7, wherein the deposit on the non-plasma surface includes organic polymers of at least one of $C_xH_y$ and $CF_y$.

* * * * *